(12) United States Patent
Janesch et al.

(10) Patent No.: US 11,545,995 B1
(45) Date of Patent: Jan. 3, 2023

(54) METHODS, DEVICES, AND SYSTEMS FOR DEMODULATION

(71) Applicant: Triad Semiconductor, Inc., Winston-Salem, NC (US)

(72) Inventors: Stephen T. Janesch, Greensboro, NC (US); William Farlow, Winston-Salem, NC (US)

(73) Assignee: TRIAD SEMICONDUCTOR, INC., Winston-Salem, NC (US)

(*) Notice: Subject to any disclaimer, the term of this patent is extended or adjusted under 35 U.S.C. 154(b) by 2 days.

(21) Appl. No.: 17/224,178

(22) Filed: Apr. 7, 2021

Related U.S. Application Data

(60) Provisional application No. 63/006,142, filed on Apr. 7, 2020.

(51) Int. Cl.
*H03M 1/00* (2006.01)
*H03M 3/00* (2006.01)
*H03M 1/06* (2006.01)
*H03M 1/12* (2006.01)

(52) U.S. Cl.
CPC ......... *H03M 3/462* (2013.01); *H03M 1/0626* (2013.01); *H03M 1/12* (2013.01)

(58) Field of Classification Search
CPC ....... H03M 3/462; H03M 1/0626; H03M 1/12
See application file for complete search history.

(56) References Cited

U.S. PATENT DOCUMENTS

| | | | | |
|---|---|---|---|---|
| 6,057,793 | A * | 5/2000 | Gong | H03H 17/0671 341/143 |
| 8,265,584 | B2 * | 9/2012 | Khoury | H04B 1/28 455/278.1 |
| 9,154,263 | B1 * | 10/2015 | Muqaibel | H04L 1/0048 |
| 2003/0012307 | A1 * | 1/2003 | Martin | H04L 27/2332 375/324 |
| 2005/0248478 | A1 * | 11/2005 | Ling | H04B 1/1036 341/118 |
| 2016/0173120 | A1 * | 6/2016 | Doare | H03M 3/378 341/120 |

OTHER PUBLICATIONS

Tecpanecatl-Xihuitl, J. Luis et al.: "Design of a Power-Efficient Interleaved CIC Architecture for Software Defined Radio Receivers", IEEE, 2005, pp. 1831-1834.
Schreier, Richard et al.: "Understanding Delta-Sigma Data Converters", IEEE, 2005, pp. 91 and 94-114.

* cited by examiner

*Primary Examiner* — Joseph J Lauture
(74) *Attorney, Agent, or Firm* — NK Patent Law

(57) ABSTRACT

Disclosed herein are devices, systems, and methods for improved demodulation. In one embodiment, a demodulator includes an input port configured to receive an analog input signal having a first frequency spectrum, a delta-sigma modulator electrically coupled with the input port, a digital downconverter electrically coupled with the delta-sigma modulator, and a filter electrically coupled with the digital downconverter. The filter is configured for a passband having a second frequency spectrum. The demodulator also includes an output port electrically coupled with the filter. The output port is configured to provide an output signal having the second frequency spectrum.

55 Claims, 8 Drawing Sheets

METHODS, DEVICES, AND SYSTEMS FOR DEMODULATION

PRIORITY CLAIM

This application claims priority to U.S. Provisional Patent Application Ser. No. 63/006,142 filed Apr. 7, 2020, titled "IMPROVED DEMODULATORS AND METHODS" the disclosure of which is incorporated herein by reference in its entirety.

TECHNICAL FIELD

The present invention relates generally to demodulators and more specifically to demodulators implemented using delta sigma analog-to-digital converters (ADCs).

BACKGROUND

Demodulators recover information content from a modulated carrier wave. For example, demodulators may be used to decode amplitude modulated (AM) signals, frequency modulated (FM) signals, phase modulated (PM) signals, quadrature amplitude modulated signals, or the like.

Disadvantages and limitations of traditional approaches to implementing demodulators will become apparent to one of ordinary skill in the art through comparison of such traditional approaches to the improved downconverters and associated methods disclosed in the present application.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are improved demodulators and associated methods. In one embodiment, a demodulator includes an input port configured to receive an analog input signal having a first frequency spectrum, a delta-sigma modulator electrically coupled with the input port, a digital downconverter electrically coupled with the delta-sigma modulator, and a filter electrically coupled with the digital downconverter. The filter is configured for a passband having a second frequency spectrum. The demodulator also includes an output port electrically coupled with the filter. The output port is configured to provide an output signal having the second frequency spectrum.

In some embodiments, the input port may comprise at least one transmission line. The transmission line may be a coaxial transmission line, a two-wire transmission line, a parallel-plate transmission line, a strip line, a microstrip line, a coplanar waveguide, or the like. In other embodiments, the transmission line may be a rectangular waveguide, a circular wave guide, an optical fiber, or the like.

In some embodiments, the output port may be a digital output port. The digital output port may be a serial port or a parallel port.

In some embodiments, the digital downconverter may be a digital multiplier. The digital multiplier may be configured to receive a 1-bit wide data stream from the delta-sigma modulator. The 1-bit wide data stream may include a digital representation of the analog input signal.

In certain embodiments, the digital downconverter may be a COordinate Rotation DIgital Computer (CORDIC). The CORDIC may be configured to receive the 1-bit wide data stream from the delta-sigma modulator.

In some embodiments, the filter may be a digital filter. In certain embodiments, the digital filter may be a digital decimation filter. In further embodiments, the digital decimation filter may be a finite impulse response (FIR) filter.

In some embodiments, the demodulator may be implemented within an integrated circuit (IC). In certain embodiments, the demodulator may be implemented within an application specific integrated circuit (ASIC).

In some embodiments, the second frequency spectrum may be a baseband frequency spectrum. In other embodiments, the second frequency spectrum may be an intermediate frequency (IF) spectrum. In further embodiments, the second frequency spectrum may be at least a portion of a quadrature (IQ) frequency spectrum.

In some embodiments, the input port may be configured to be electrically coupled with an analog front end. The analog front end may include an analog bandpass filter. The analog bandpass filter may be configured to provide the analog input signal. Additionally, the analog front end may be a radio frequency (RF) front end.

In some embodiments, the analog front end may be an optical analog front end. In other embodiments, the analog front end may be configured to be coupled with a transducer. In still other embodiments, the analog front end may be configured to be coupled with an antenna. The analog front end may also include a low noise amplifier (LNA)

In some embodiments, the first frequency spectrum may have a first center frequency greater than 25 kilohertz (kHz). The delta sigma modulator may be configured for an order of 3 and may have a zero in its noise transfer function centered at or near the first center frequency. The filter may be a decimation filter configured for an order of 4.

In another embodiment, a method is disclosed for downconversion using a demodulator. The method includes receiving an analog input signal at an input port of the demodulator and providing an output signal at an output port of the demodulator. The analog input signal has a first frequency spectrum and the output signal has a second frequency spectrum. The demodulator includes a delta-sigma modulator electrically coupled with the input port and a digital downconverter electrically coupled with the delta-sigma modulator. The demodulator further includes a filter electrically coupled with the digital downconverter and configured for a passband having the second frequency spectrum. The filter is also electrically coupled with the output port.

In some embodiments, the input port may comprise at least one transmission line. The transmission line may be a coaxial transmission line, a two-wire transmission line, a parallel-plate transmission line, a strip line, a microstrip line, a coplanar waveguide, or the like. In other embodiments, the transmission line may be a rectangular waveguide, a circular wave guide, an optical fiber, or the like.

In some embodiments, the output port may be a digital output port. The digital output port may be a serial port or a parallel port.

In some embodiments, the digital downconverter may be a digital multiplier. The digital multiplier may be configured to receive a 1-bit wide data stream from the delta-sigma modulator. The 1-bit wide data stream may include a digital representation of the analog input signal.

In certain embodiments, the digital downconverter may be a COordinate Rotation DIgital Computer (CORDIC). The CORDIC may be configured to receive the 1-bit wide data stream from the delta-sigma modulator.

In some embodiments, the filter may be a digital filter. In certain embodiments, the digital filter may be a digital decimation filter. In further embodiments, the digital decimation filter may be a finite impulse response (FIR) filter.

In some embodiments, the demodulator may be implemented within an integrated circuit (IC). In certain embodiments, the demodulator may be implemented within an application specific integrated circuit (ASIC).

In some embodiments, the second frequency spectrum may be a baseband frequency spectrum. In other embodiments, the second frequency spectrum may be an intermediate frequency (IF) spectrum. In further embodiments, the second frequency spectrum may be at least a portion of a quadrature (IQ) frequency spectrum.

In some embodiments, the input port may be configured to be electrically coupled with an analog front end. The analog front end may include an analog bandpass filter. The analog bandpass filter may be configured to provide the analog input signal. Additionally, the analog front end may be a radio frequency (RF) front end.

In some embodiments, the analog front end may be an optical analog front end. In other embodiments, the analog front end may be configured to be coupled with a transducer. In still other embodiments, the analog front end may be configured to be coupled with an antenna. The analog front end may also include a low noise amplifier (LNA)

In some embodiments, the first frequency spectrum may have a first center frequency greater than 25 kilohertz (kHz). The delta sigma modulator may be configured for an order of 3 and may have a zero in its noise transfer function centered at or near the first center frequency. The filter may be a decimation filter configured for an order of 4.

In another embodiment, a method is disclosed for forming an IC. The method includes providing a demodulator on a substrate. The demodulator includes an input port configured to receive an analog input signal having a first frequency spectrum, a delta-sigma modulator electrically coupled with the input port, a digital downconverter electrically coupled with the delta-sigma modulator, and a filter electrically coupled with the digital downconverter. The filter is configured for a passband having a second frequency spectrum. The demodulator also includes an output port electrically coupled with the filter. The output port is configured to provide an output signal having the second frequency spectrum.

In some embodiments, the input port may comprise at least one transmission line. The transmission line may be a coaxial transmission line, a two-wire transmission line, a parallel-plate transmission line, a strip line, a microstrip line, a coplanar waveguide, or the like. In other embodiments, the transmission line may be a rectangular waveguide, a circular wave guide, an optical fiber, or the like.

In some embodiments, the output port may be a digital output port. The digital output port may be a serial port or a parallel port.

In some embodiments, the digital downconverter may be a digital multiplier. The digital multiplier may be configured to receive a 1-bit wide data stream from the delta-sigma modulator. The 1-bit wide data stream may include a digital representation of the analog input signal.

In certain embodiments, the digital downconverter may be a COordinate Rotation DIgital Computer (CORDIC). The CORDIC may be configured to receive the 1-bit wide data stream from the delta-sigma modulator.

In some embodiments, the filter may be a digital filter. In certain embodiments, the digital filter may be a digital decimation filter. In further embodiments, the digital decimation filter may be a finite impulse response (FIR) filter.

In some embodiments, the demodulator may be implemented within an integrated circuit (IC). In certain embodiments, the demodulator may be implemented within an application specific integrated circuit (ASIC).

In some embodiments, the second frequency spectrum may be a baseband frequency spectrum. In other embodiments, the second frequency spectrum may be an intermediate frequency (IF) spectrum. In further embodiments, the second frequency spectrum may be at least a portion of a quadrature (IQ) frequency spectrum.

In some embodiments, the input port may be configured to be electrically coupled with an analog front end. The analog front end may include an analog bandpass filter. The analog bandpass filter may be configured to provide the analog input signal. Additionally, the analog front end may be a radio frequency (RF) front end.

In some embodiments, the analog front end may be an optical analog front end. In other embodiments, the analog front end may be configured to be coupled with a transducer. In still other embodiments, the analog front end may be configured to be coupled with an antenna. The analog front end may also include a low noise amplifier (LNA)

In some embodiments, the first frequency spectrum may have a first center frequency greater than 25 kilohertz (kHz). The delta sigma modulator may be configured for an order of 3 and may have a zero in its noise transfer function centered at or near the first center frequency. The filter may be a decimation filter configured for an order of 4.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1:
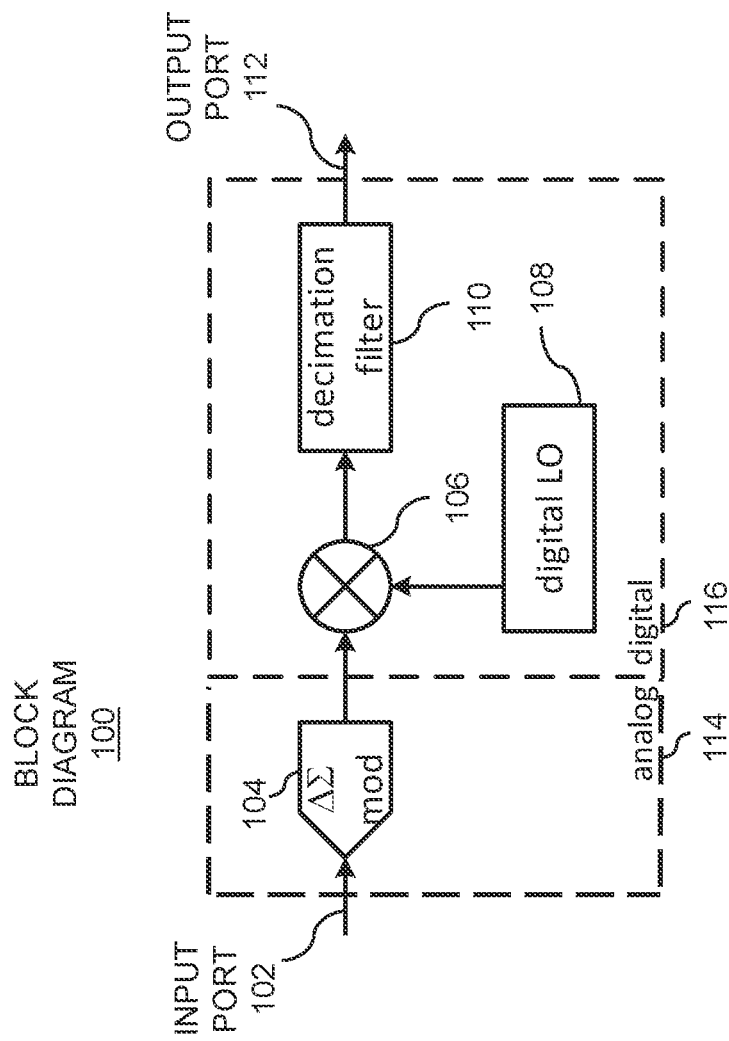
FIG. 1 depicts a block diagram illustrating a simplified implementation of an improved demodulator in accordance with embodiments of the present disclosure.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

Disclosed herein are demodulators using analog-to-digital converters (ADCs) suited for a bandlimited signal, such as a signal modulated on a carrier in a radio frequency (RF) receiver. The demodulators also perform down-conversion on the bandlimited signal to a baseband frequency or to a lower carrier intermediate (IF) frequency. Typical ADC architectures for demodulators use a delta-sigma ADC directly coupled with a decimation filter. A down-conversion of the bandlimited signal is performed after passing through the decimation filter. Architectures disclosed herein perform a down-conversion on an output signal from a delta-sigma modulator before feeding into a decimation filter.

FIG. 1 depicts a block diagram 100 illustrating a simplified implementation of an improved demodulator in accordance with embodiments of the present disclosure. The improved demodulator includes an input port 102 configured to receive an analog input signal having a first frequency spectrum. The input port may comprise at least one transmission line. For example, the transmission line may be a coaxial transmission line, a two-wire transmission line, a parallel-plate transmission line, a strip line, a microstrip line, a coplanar waveguide, or the like. In other embodiments, the transmission line may be a rectangular waveguide, a circular wave guide, an optical fiber, or the like.

The input port 102 is electrically coupled with an input of a delta-sigma modulator (ΔΣ mod) 104. An output of the delta-sigma modulator 104 is electrically coupled with a first input of a digital downconverter 106 (e.g. mixer). An output of a digital local oscillator (LO) 108 is electrically coupled with a second input of the digital downconverter 106. An output of the digital downconverter 106 is electrically coupled with an input of a decimation filter 110. The decimation filter 110 is configured for a passband having a second frequency spectrum. The demodulator also includes an output port 112 electrically coupled with a digital output of the decimation filter 110. The output port 112 is configured to provide an output signal having the second frequency spectrum. The output port 112 is a digital output port and may be a serial port or a parallel port. FIG. 1 also depicts an analog section 114 and a digital section 116 of the improved demodulator.

In many wireless communication systems a design objective is to process radio (RF) signals in a receiver (e.g. demodulator); wherein the RF signals of interest are bandlimited in nature. Basically, the RF frequencies of interest do not extend to direct current (DC). Often the total signal bandwidth is a small proportion of the center frequency. Examples include broadcast radio and television, cordless and cellular telephones, wireless networking systems (e.g. 802.11.x) or the like.

Figure 2:
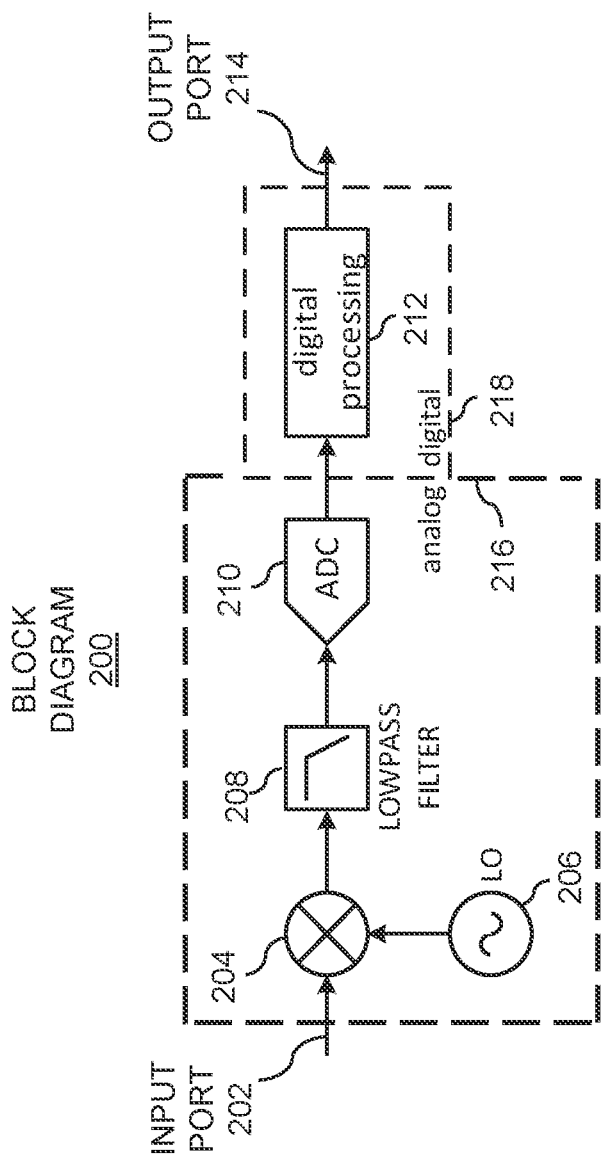
FIG. 2 depicts a block diagram illustrating a typical architecture performing down-conversion before analog-to-digital conversion including analog and digital sections of the architecture in accordance with embodiments of the present disclosure.

FIG. 2 depicts a block diagram 200 illustrating a typical architecture performing down-conversion before analog-to-digital conversion in accordance with embodiments of the present disclosure.

To perform digital signal processing on a received RF signal at an input port 202, analog-to-digital conversion must take place. This is currently done in one of two ways. The traditional approach (as illustrated in FIG. 2) is to perform a down-conversion on the RF signal in the analog domain using a mixer 204 driven by a local oscillator (LO) 206 to a low intermediate frequency (IF) or a baseband frequency. An output of the mixer 204 drives a low-pass filter 208 which is needed to attenuate the high-side mixing product. An output of the low-pass filter 208 is fed to a low speed ADC 210. Digital processing circuitry 212 further processes the IF or baseband frequency before being provided by output port 214. FIG. 2 also depicts an analog section 216 and a digital section 218 of this architecture.

Drawbacks to this method include increased noise at the output port 214 due to harmonics of the LO 206 and leakage between ports on the mixer 204; distortion from nonlinearities in the mixer 204; and difficulty in matching gain and phase between signal paths in quadrature (IQ) or multichannel receivers.

Figure 3:
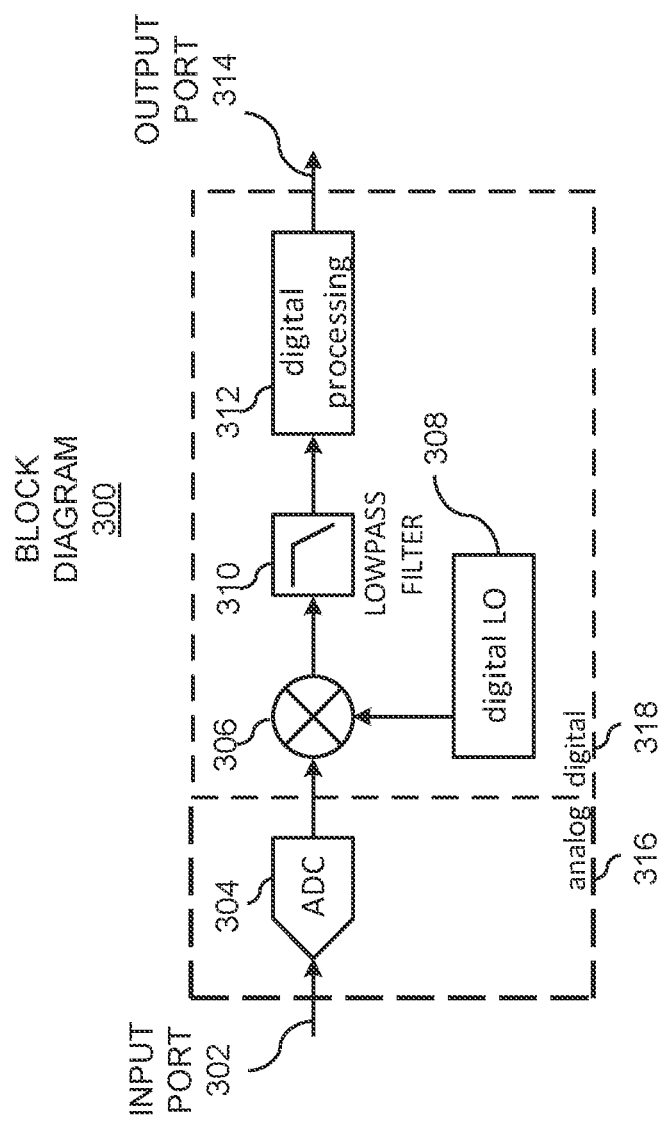
FIG. 3 depicts a block diagram illustrating a demodulator architecture performing down-conversion after an analog-to-digital conversion including analog and digital sections of the architecture in accordance with embodiments of the present disclosure.

FIG. 3 depicts a block diagram 300 illustrating a demodulator architecture performing down-conversion after an analog-to-digital conversion in accordance with embodiments of the present disclosure This more recently adopted approach uses a high speed ADC 304 followed by a digital mixer 306, a digital LO 308, a low pass filter 310, and additional digital processing circuitry 312. This approach performs the down-conversion to baseband in the digital domain. This architecture of FIG. 3 is also called a software defined radio (SDR) architecture. However, the operations following the ADC 304 may be implemented in digital hardware as well as software. Because the RF signal feeds directly into the ADC 304, this architecture requires much higher sample rate for the ADC 304 to accommodate the higher frequency of the received signal. The ADC 304 also requires a higher resolution because the noise bandwidth has not been reduced by post down conversion filtering. However, note that a low pass filter 310 is still required after the mixer to remove the high frequency mixing products outside the frequency of interest after down-conversion. FIG. 3 also depicts an analog section 316 and a digital section 318 of this architecture.

The advantage to this approach is that the operations following the ADC 304 can be performed without adding noise and/or causing distortion, and with arbitrarily high precision and matching. The disadvantage is an increase in complexity of the ADC 304, the power consumption in the ADC 304, and the digital operations that follow. For example, in one embodiment the mixer 306 must multiply a 24-bit ADC value and 24-bit LO value at the higher sampling rate.

Figure 4:
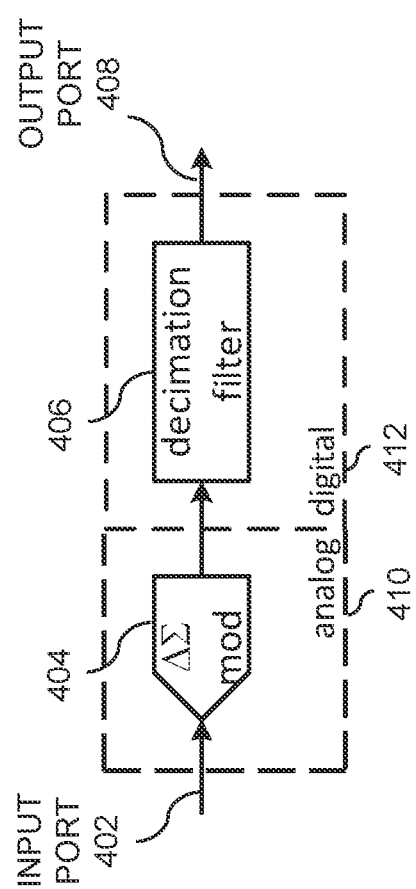
FIG. 4 depicts a block diagram illustrating a delta-sigma (ΔΣ) ADC including a delta-sigma modulator and a decimation filter including analog and digital sections of the architecture in accordance with embodiments of the present disclosure.

FIG. 4 depicts a block diagram 400 illustrating a delta-sigma (Δs) ADC in accordance with embodiments of the present disclosure. The delta-sigma ADC includes an input port 402 coupled to a delta-sigma modulator 404 and a decimation filter 406 coupled with an output port 408. FIG. 4 also depicts an analog section 410 and a digital section 412 of this architecture.

High fidelity ADCs used in SDR architectures typically employ this delta-sigma architecture of FIG. 4. Delta-sigma ADCs normally have at least two stages. The first stage is a delta-sigma modulator and the second stage is a decimation filter as depicted in FIG. 4. Delta-sigma modulators are oversampled ADCs. Specifically, these ADCs sample the signal at a much greater frequency than the Nyquist rate. The ADC sample rate is typically 64 to 1024 times the Nyquist rate. Delta-sigma modulators also put out a much lower resolution signal. The output is typically only 1-bit of resolution. The decimation filter 406 turns the high rate 1-bit modulator output into a low rate (i.e. decimated) multi-bit digital value while filtering out the high frequency noise of the modulator. The output sample rate of the decimation filter 406 must still be above the RF signal's Nyquist rate. As the ratio between input and output frequencies of the decimation filter (the decimation rate, or oversampling ratio) increases, so does the resolution of the delta-sigma ADC 404.

In any ADC application, the in-band noise level generated by the ADC must be sufficiently low to maintain the fidelity of the desired signal. In delta-sigma ADCs, this includes quantization noise. Other things being equal, quantization noise at a given frequency can be reduced by increasing the sample rate of the modulator or increasing the order of the modulator. Both options result in a more complicated design with higher power consumption. As such, it is desirable to keep the delta-sigma modulator order as low as possible.

Figure 5A:
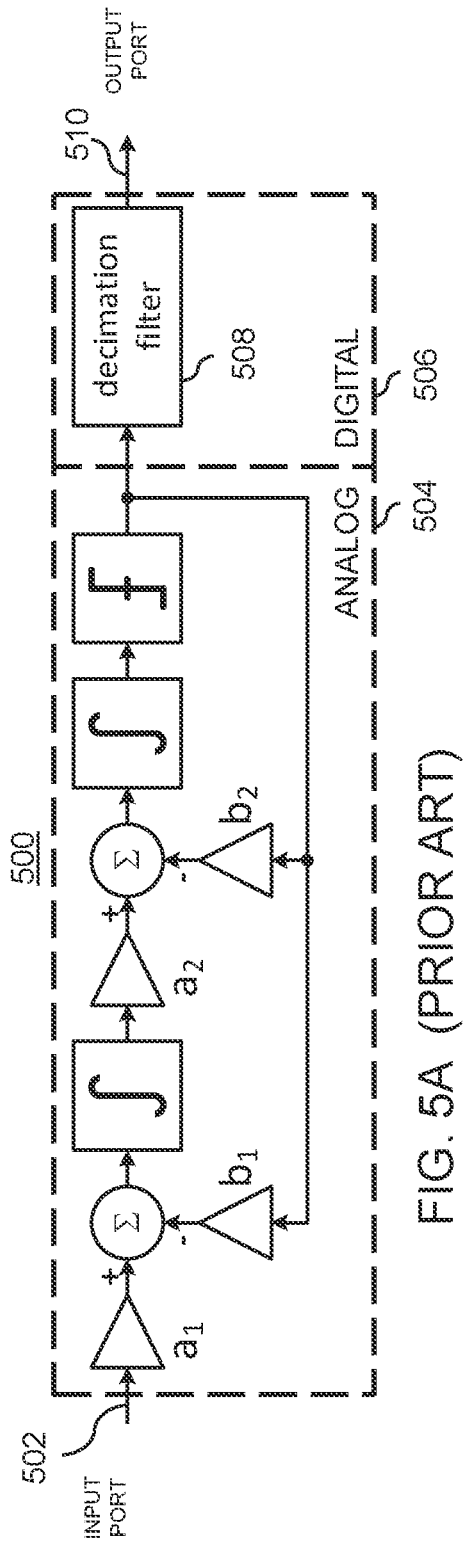
FIG. 5A depicts a block diagram illustrating a generalized second order delta-sigma modulator with forward gains "a" and quantized feedback gains "b" in accordance with embodiments of the present disclosure.
Figure 5B:
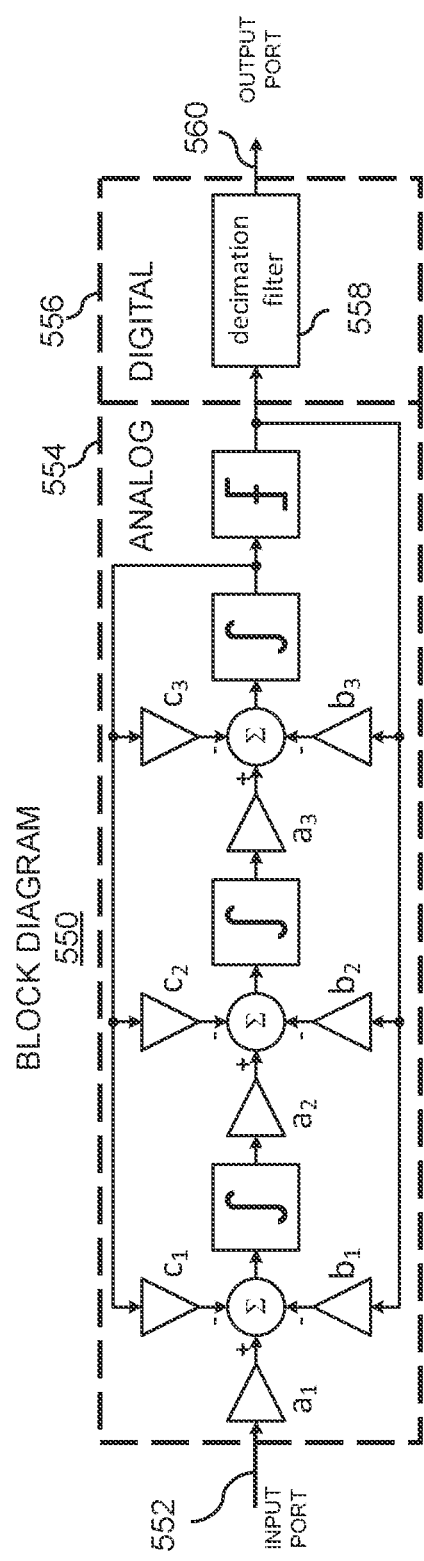
FIG. 5B depicts a block diagram illustrating a generalized third order delta-sigma modulator with forward gains "a", quantized feedback gains "b", and proportional feedback gains "c" in accordance with embodiments of the present disclosure

FIG. 5A and FIG. 5B show generalized second and third order modulators, including decimation filters in accordance with embodiments of the present disclosure. Specifically, FIG. 5A depicts a block diagram 500 illustrating a generalized second order delta-sigma modulator with forward gains "a" and quantized feedback gains "b". The generalized second order delta-sigma modulator comprises an input port 502 configured to receive an analog signal, an analog section 504, a digital section 506 including a decimation filter 508, and an output port 510 configured to provide a digital signal.

FIG. 5B depicts a block diagram 550 illustrating a generalized third order delta-sigma modulator with forward gains "a", quantized feedback gains "b", and proportional feedback gains "c". The generalized third order delta-sigma modulator comprises an input port 552 configured to receive an analog signal, an analog section 554, a digital section 556 including a decimation filter 558, and an output port 560 configured to provide a digital signal.

The forward path in the second order modulator in FIG. 5A has two amplify/sum/integrator stages followed by a 1-bit quantizer. The quantized gain is fed back to the two summers. The third order modulator in FIG. 5B adds an amplify/sum/integrate stage, as well as proportional feedback paths. If the proportional feedback gains "c" in FIG. 5B are all zero, then all the zeros of the noise transfer function appear at DC.

Figure 6:
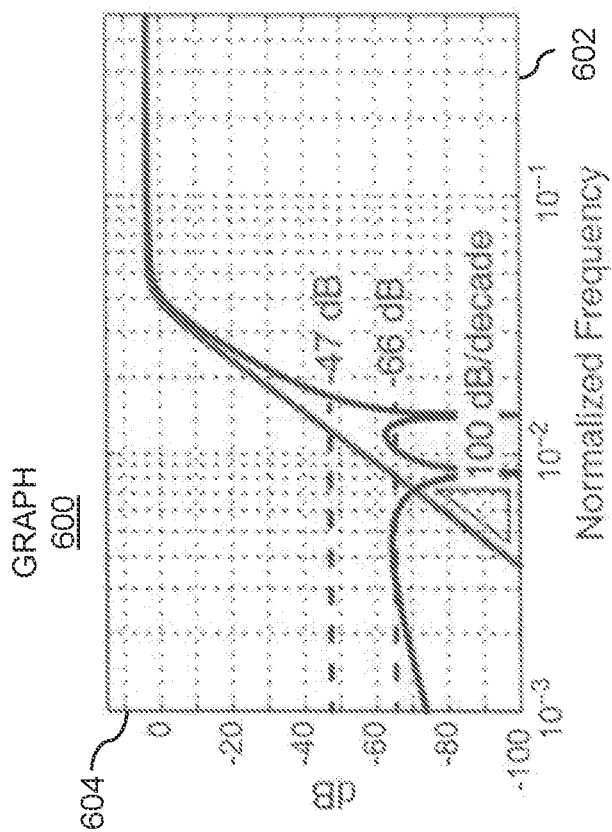
FIG. 6 depicts a graph illustrating an effect of creating noise transfer function zeros away from DC in a fifth order delta-sigma modulator in accordance with embodiments of the present disclosure.

FIG. 6 depicts a graph 600 illustrating an effect of creating noise transfer function zeros away from DC in a fifth order delta-sigma modulator in accordance with embodiments of the present disclosure. The x-axis 602 depicts a normalized frequency scale and the y-axis 604 depicts frequency attenuation in decibels (dB). The graph 600 of FIG. 6 may be found in Chapter 4 FIG. 4.10 (page 109) of Schreier, R., and Temes, G., "Understanding Delta-Sigma Data Converters", IEEE Press 2005. Piscataway, N.J. [ISBN-13: 978-0471465850].

Selecting the correct nonzero values for "c" of FIG. 5B, moves pairs of zeros away from DC and can suppress the quantization noise to extend the bandwidth of the ADC, as depicted in the fifth order delta-sigma modulator graph 600 of FIG. 6.

In a bandlimited application, the zero(s) may be placed in the noise transfer function at the frequency band of interest. This technique reduces the in-band noise without having to resort to a higher order modulator.

Improved demodulator architectures disclosed herein offer solutions to achieve the benefits of the SDR architecture without the increase in complexity of the ADC, mixer, and low pass filter.

These improved demodulator architectures simplify the mixing by multiplying the LO with the 1-bit resolution output of the ΔΣ, modulator. This benefits the overall system by allowing the decimation filter to perform both decimation and suppression of the upper mixing product, and also provides the opportunity to simplify the ΔΣ, modulator from 5th or 7th order to third order with noise transfer function zeros moved away from DC. Basically the improved demodulator architectures use a baseband modulator with 1-bit output rather than a bandpass modulator preceding the mixer.

Figure 7:
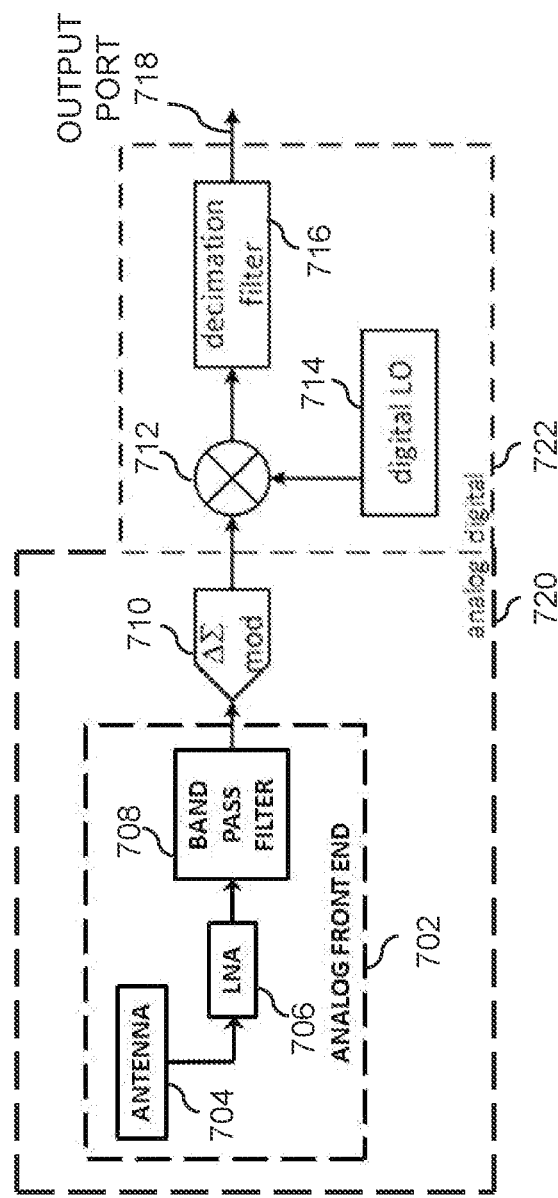
FIG. 7 depicts a block diagram illustrating the simplified implementation of the improved demodulator of FIG. 1 including an analog front end in accordance with embodiments of the present disclosure.

FIG. 7 depicts a block diagram 700 illustrating the simplified implementation of the improved demodulator of FIG. 1 including an analog front end 702 in accordance with embodiments of the present disclosure. The analog front end 702 includes and antenna 704, a low noise amplifier (LNA) 706, and a band pass filter 708. In other embodiments, the analog front end may be an analog optical receiver. The analog optical receiver may be configured for connection to a fiber optic cable or be configured to receive a free-space optical signal. In still other embodiments, the analog front-end may be configured to be coupled to a wired connection such as a cable television (CATV) system. One such example would be a Data Over Cable Service Interface Specification (DOCSIS) CATV system.

Similar to the block diagram 100 of FIG. 1, block diagram 700 also includes a delta-sigma modulator (ΔΣ mod) 710, a downconverter 712 (e.g. digital mixer), a digital LO 714, and a decimation filter 716 coupled with an output port 718. As previously disclosed, the down-conversion is performed directly after the delta-sigma modulation. FIG. 7 also depicts an analog section 720 and a digital section 722 of this architecture.

The digital LO can be generated using a sine look up table (LUT), a CORDIC (Coordinate Rotation DIgital Computer), or other such digital circuitry. The decimation filter output rate only needs to be high enough to accurately represent the down-converted output signal, rather than the RF modulated signal. The decimation filter order can be reduced to four, to match the reduced order of the delta-sigma modulator.

A CORDIC offers the best flexibility to generate the LO if the relationship between the LO frequency and the clock is not known, or if frequency tunability of the demodulator is desired. If the frequencies can be selected such that the clock is always an integer multiple of the LO, thus limiting the number of values the LO will assume, a sine LUT could reduce complexity.

Figure 8:
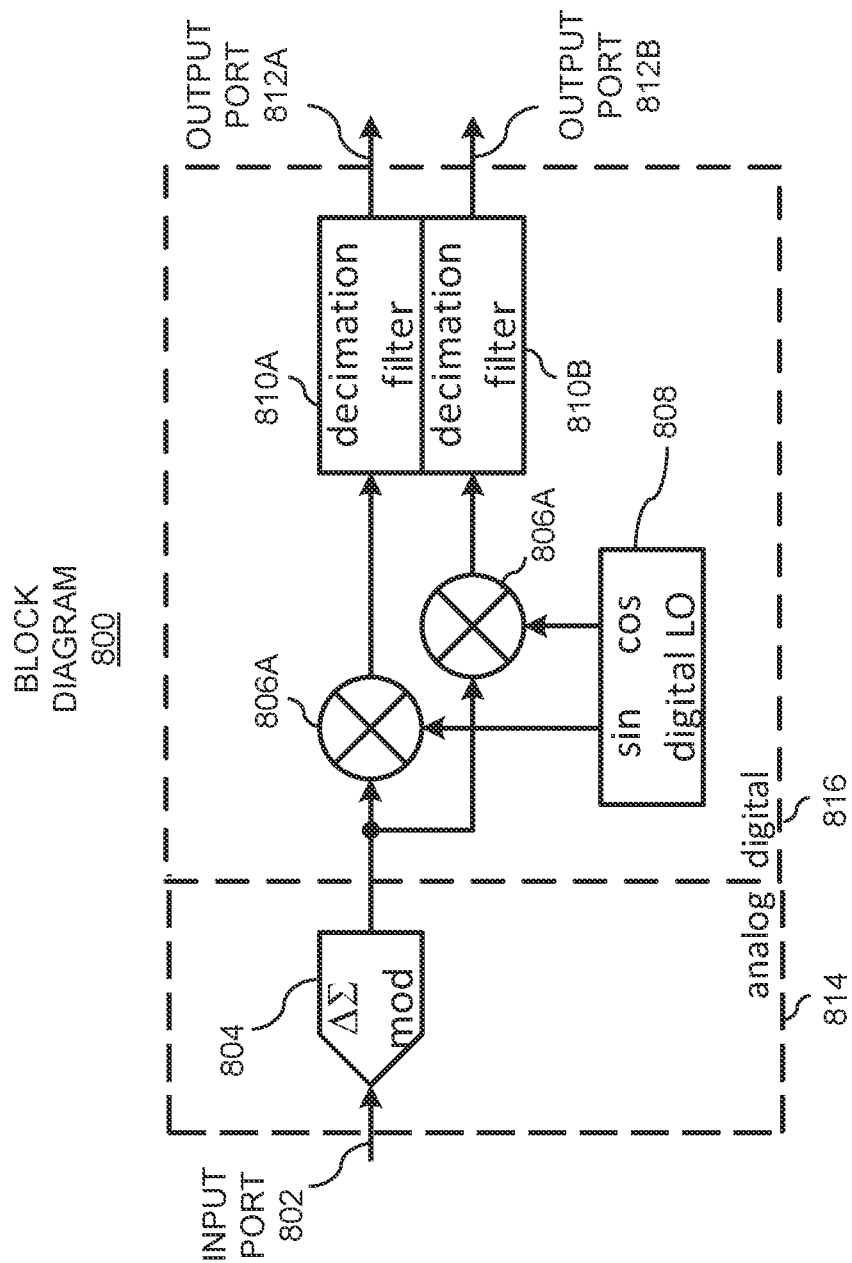
FIG. 8 depicts a block diagram illustrating an improved demodulator architecture used for a quadrature (IQ) down-conversion system in accordance with embodiments of the present disclosure.

Systems requiring quadrature (IQ) down-conversion to baseband also lend themselves to the improved architectures disclosed. For example, FIG. 8 depicts a block diagram 800 illustrating an improved demodulator architecture used for a quadrature (IQ) down-conversion system in accordance with embodiments of the present disclosure. This improved demodulator architecture includes an input port 802 configured to receive an analog signal, a delta-sigma modulator (ΔΣ mod) 804, downconverters 806A and 806B (e.g. digital mixers), a digital LO 808 including sine and cosine phased oscillator outputs, decimation filters 810A and 810B coupled with output ports 812A and 812B. FIG. 8 also depicts an analog section 814 and a digital section 816 of this architecture. As previously disclosed, the down-conversion is performed directly after the delta-sigma modulation.

Both the LUT and CORDIC algorithms can provide both the sine and cosine phases or the digital LO 808, maintaining near perfect phase and amplitude matching, giving near perfect image rejection. This benefit also extends to systems with multiple receive channels. The separate downconverters 806A and 806B and the separate decimation filters 810A and 810B are used for the I signals and the Q signals.

Decimation filters typically have evenly spaced nulls in their frequency response at harmonics of the output sample frequency. It is advantageous to the design if the upper mixing product frequency falls in one of the decimation filter nulls.

Tuning of the passband may be accomplished in one of two ways. One is to simply scale the clock frequencies of the delta-sigma modulator (ΔΣ mod) 804 and the digital LO 808 by the desired shift in passband frequency, as these frequencies scale directly with their clocks. Another is to change the phase increment when creating the LO frequency (a CORDIC is recommended for best flexibility) and adjust the proportional feedback gains "c" to shift the zeros of the noise transfer function.

In summary, the disclosed improved architectures herein offer accuracy of digital down-conversion without the severe current consumption penalty of traditional designs. This improvement is accomplished by performing a digital mathematical operation (i.e. multiplying by an LO) on the output of the delta-sigma modulator before feeding it into a decimation filter. Since the typical delta-signal modulator output is only 1 bit wide, its values are represented by +/−1 (rather than 1 and 0), so a complicated high speed multiplier is not needed. The decimation filter also performs the function of suppressing the high frequency mixing products.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including object oriented and/or procedural programming languages. For example, programming languages may include, but are not limited to: Ruby, JavaScript, Java, Python, Ruby, PHP, C, C++, C#, Objective-C, Go, Scala, Swift, Kotlin, OCaml, or the like.

Aspects of the present invention are described above with reference to block diagrams of methods, apparatus (systems) and computer program products according to embodiments of the invention. It will be understood that each block of the illustrations and/or block diagrams, and combinations thereof, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A demodulator comprising:
   an input port configured to receive an analog input signal having a first frequency spectrum;
   a delta-sigma modulator electrically coupled with the input port;
   a digital downconverter electrically coupled with the delta-sigma modulator, wherein:
   the digital downconverter is a digital multiplier;
   the digital multiplier is configured to receive a 1-bit wide data stream from the delta-sigma modulator; and
   the 1-bit wide data stream comprises a digital representation of the analog input signal;
   a filter electrically coupled with the digital downconverter and configured for a passband having a second frequency spectrum; and
   an output port electrically coupled with the filter and configured to provide an output signal having the second frequency spectrum.

2. The demodulator of claim 1, wherein the filter is a digital filter.

3. The demodulator of claim 2, wherein the digital filter is a digital decimation filter.

4. The demodulator of claim 3, wherein the digital decimation filter is a finite impulse response (FIR) filter.

5. The demodulator of claim 1, wherein the demodulator is implemented within an integrated circuit (IC).

6. The demodulator of claim 5, wherein the demodulator is implemented within an application specific integrated circuit (ASIC).

7. The demodulator of claim 1, wherein the second frequency spectrum is a baseband frequency spectrum.

8. The demodulator of claim 1, wherein the second frequency spectrum is an intermediate frequency (IF) spectrum.

9. The demodulator of claim 1, wherein the second frequency spectrum is at least a portion of a quadrature (IQ) frequency spectrum.

10. The demodulator of claim 1, wherein the input port is configured to be electrically coupled with an analog front end.

11. The demodulator of claim 10, wherein the analog front end comprises an analog bandpass filter and the analog bandpass filter is configured to provide the analog input signal.

12. The demodulator of claim 10, wherein the analog front end is an optical analog front end.

13. The demodulator of claim 10, wherein the analog front end is a radio frequency (RF) front end.

14. The demodulator of claim 10, wherein the analog front end is configured to be coupled with a transducer.

15. The demodulator of claim 10, wherein the analog front end is configured to be coupled with an antenna.

16. The demodulator of claim 1, wherein:
the first frequency spectrum has a first center frequency greater that 25 kilohertz (kHz);
the delta-sigma modulator is configured for an order of 3;
the delta-sigma modulator is further configured to have a noise transfer function having a zero function centered approximately at the first center frequency; and
the filter is a decimation filter configured for an order of 4.

17. A method implemented on a device comprising a demodulator, the method comprising:
receiving an analog input signal at an input port of the demodulator, wherein:
the analog input signal has a first frequency spectrum; and
the demodulator comprises:
a delta-sigma modulator electrically coupled with the input port;
a digital downconverter electrically coupled with the delta-sigma modulator, wherein:
the digital downconverter is a digital multiplier;
the digital multiplier is configured to receive a 1-bit wide data stream from the delta-sigma modulator; and
the 1-bit wide data stream comprises a digital representation of the analog input signal;
a filter electrically coupled with the digital downconverter and configured for a passband having a second frequency spectrum; and
an output port electrically coupled with the filter; and
providing an output signal having the second frequency spectrum from the output port.

18. A method of forming an integrated circuit (IC), the method comprising:
providing a demodulator on a substrate, the demodulator comprising:
an input port configured to receive an analog input signal having a first frequency spectrum;
a delta-sigma modulator electrically coupled with the input port;
a digital downconverter electrically coupled with the delta-sigma modulator, wherein:
the digital downconverter is a digital multiplier;
the digital multiplier is configured to receive a 1-bit wide data stream from the delta-sigma modulator; and
the 1-bit wide data stream comprises a digital representation of the analog input signal;
a filter electrically coupled with the digital downconverter and configured for a passband having a second frequency spectrum; and
an output port electrically coupled with the filter and configured to provide an output signal having the second frequency spectrum.

19. A demodulator comprising:
an input port configured to receive an analog input signal having a first frequency spectrum;
a delta-sigma modulator electrically coupled with the input port;
a digital downconverter electrically coupled with the delta-sigma modulator, wherein:
the digital downconverter is a COordinate Rotation DIgital Computer (CORDIC);
the CORDIC is configured to receive a 1-bit wide data stream from the delta-sigma modulator; and
the 1-bit wide data stream comprises a digital representation of the analog input signal;
a filter electrically coupled with the digital downconverter and configured for a passband having a second frequency spectrum; and
an output port electrically coupled with the filter and configured to provide an output signal having the second frequency spectrum.

20. The demodulator of claim 19, wherein the filter is a digital filter.

21. The demodulator of claim 20, wherein the digital filter is a digital decimation filter.

22. The demodulator of claim 21, wherein the digital decimation filter is a finite impulse response (FIR) filter.

23. The demodulator of claim 19, wherein the demodulator is implemented within an integrated circuit (IC).

24. The demodulator of claim 23, wherein the demodulator is implemented within an application specific integrated circuit (ASIC).

25. The demodulator of claim 19, wherein the second frequency spectrum is a baseband frequency spectrum.

26. The demodulator of claim 19, wherein the second frequency spectrum is an intermediate frequency (IF) spectrum.

27. The demodulator of claim 19, wherein the second frequency spectrum is at least a portion of a quadrature (IQ) frequency spectrum.

28. The demodulator of claim 19, wherein the input port is configured to be electrically coupled with an analog front end.

29. The demodulator of claim 28, wherein the analog front end comprises an analog bandpass filter and the analog bandpass filter is configured to provide the analog input signal.

30. The demodulator of claim 28, wherein the analog front end is an optical analog front end.

31. The demodulator of claim 28, wherein the analog front end is a radio frequency (RF) front end.

32. The demodulator of claim 28, wherein the analog front end is configured to be coupled with a transducer.

33. The demodulator of claim 28, wherein the analog front end is configured to be coupled with an antenna.

34. The demodulator of claim 19, wherein:
the first frequency spectrum has a first center frequency greater that 25 kilohertz (kHz);
the delta-sigma modulator is configured for an order of 3;

the delta-sigma modulator is further configured to have a noise transfer function having a zero function centered approximately at the first center frequency; and
the filter is a decimation filter configured for an order of 4.

35. A method implemented on a device comprising a demodulator, the method comprising:
receiving an analog input signal at an input port of the demodulator, wherein:
the analog input signal has a first frequency spectrum; and
the demodulator comprises:
a delta-sigma modulator electrically coupled with the input port;
a digital downconverter electrically coupled with the delta-sigma modulator, wherein:
the digital downconverter is a COordinate Rotation DIgital Computer (CORDIC);
the CORDIC is configured to receive a 1-bit wide data stream from the delta-sigma modulator; and
the 1-bit wide data stream comprises a digital representation of the analog input signal;
a filter electrically coupled with the digital downconverter and configured for a passband having a second frequency spectrum; and
an output port electrically coupled with the filter; and
providing an output signal having the second frequency spectrum from the output port.

36. A demodulator comprising:
an input port configured to receive an analog input signal having a first frequency spectrum, wherein the first frequency spectrum has a first center frequency greater that 25 kilohertz (kHz);
a delta-sigma modulator electrically coupled with the input port, wherein:
the delta-sigma modulator is configured for an order of 3; and
the delta-sigma modulator is further configured to have a noise transfer function having a zero function centered approximately at the first center frequency;
a digital downconverter electrically coupled with the delta-sigma modulator;
a filter electrically coupled with the digital downconverter and configured for a passband having a second frequency spectrum, wherein the filter is a decimation filter configured for an order of 4; and
an output port electrically coupled with the filter and configured to provide an output signal having the second frequency spectrum.

37. The demodulator of claim 36, wherein:
the digital downconverter is a digital multiplier;
the digital multiplier is configured to receive a 1-bit wide data stream from the delta-sigma modulator; and
the 1-bit wide data stream comprises a digital representation of the analog input signal.

38. The demodulator of claim 36, wherein:
the digital downconverter is a COordinate Rotation DIgital Computer (CORDIC);
the CORDIC is configured to receive a 1-bit wide data stream from the delta-sigma modulator; and
the 1-bit wide data stream comprises a digital representation of the analog input signal.

39. The demodulator of claim 36, wherein the filter is a digital filter.

40. The demodulator of claim 39, wherein the digital filter is a digital decimation filter.

41. The demodulator of claim 40, wherein the digital decimation filter is a finite impulse response (FIR) filter.

42. The demodulator of claim 36, wherein the demodulator is implemented within an integrated circuit (IC).

43. The demodulator of claim 42, wherein the demodulator is implemented within an application specific integrated circuit (ASIC).

44. The demodulator of claim 36, wherein the second frequency spectrum is a baseband frequency spectrum.

45. The demodulator of claim 36, wherein the second frequency spectrum is an intermediate frequency (IF) spectrum.

46. The demodulator of claim 36, wherein the second frequency spectrum is at least a portion of a quadrature (IQ) frequency spectrum.

47. The demodulator of claim 36, wherein the input port is configured to be electrically coupled with an analog front end.

48. The demodulator of claim 47, wherein the analog front end comprises an analog bandpass filter and the analog bandpass filter is configured to provide the analog input signal.

49. The demodulator of claim 47, wherein the analog front end is an optical analog front end.

50. The demodulator of claim 47, wherein the analog front end is a radio frequency (RF) front end.

51. The demodulator of claim 47, wherein the analog front end is configured to be coupled with a transducer.

52. The demodulator of claim 47, wherein the analog front end is configured to be coupled with an antenna.

53. A method implemented on a device comprising a demodulator, the method comprising:
receiving an analog input signal at an input port of the demodulator, wherein:
the analog input signal has a first frequency spectrum, wherein the first frequency spectrum has a first center frequency greater that 25 kilohertz (kHz); and
the demodulator comprises:
a delta-sigma modulator electrically coupled with the input port, wherein:
the delta-sigma modulator is configured for an order of 3; and
the delta-sigma modulator is further configured to have a noise transfer function having a zero function centered approximately at the first center frequency;
a digital downconverter electrically coupled with the delta-sigma modulator;
a filter electrically coupled with the digital downconverter and configured for a passband having a second frequency spectrum, wherein the filter is a decimation filter configured for an order of 4; and
an output port electrically coupled with the filter; and
providing an output signal having the second frequency spectrum from the output port.

54. A method of forming an integrated circuit (IC), the method comprising: providing a demodulator on a substrate, the demodulator comprising:
an input port configured to receive an analog input signal having a first frequency spectrum, wherein the first frequency spectrum has a first center frequency greater that 25 kilohertz (kHz);
a delta-sigma modulator electrically coupled with the input port, wherein:
the delta-sigma modulator is configured for an order of 3; and the delta-sigma modulator is further configured to have a noise transfer function having a zero function centered approximately at the first center frequency;

a digital downconverter electrically coupled with the delta-sigma modulator;

a filter electrically coupled with the digital downconverter and configured for a passband having a second frequency spectrum, wherein the filter is a decimation filter configured for an order of 4; and an output port electrically coupled with the filter and configured to provide an output signal having the second frequency spectrum.

55. A method of forming an integrated circuit (IC), the method comprising: providing a demodulator on a substrate, the demodulator comprising:

an input port configured to receive an analog input signal having a first frequency spectrum;

a delta-sigma modulator electrically coupled with the input port;

a digital downconverter electrically coupled with the delta-sigma modulator, wherein:

the digital downconverter is a COordinate Rotation DIgital Computer (CORDIC);

the CORDIC is configured to receive a 1-bit wide data stream from the delta-sigma modulator; and the 1-bit wide data stream comprises a digital representation of the analog input signal;

a filter electrically coupled with the digital downconverter and configured for a passband having a second frequency spectrum; and an output port electrically coupled with the filter and configured to provide an output signal having the second frequency spectrum.

* * * * *